United States Patent
Kathiresan et al.

(10) Patent No.: US 8,203,388 B2
(45) Date of Patent: Jun. 19, 2012

(54) LOW NOISE AMPLIFIER

(75) Inventors: Ganesh Kathiresan, Oxfordshire (GB);
Kritsapon Leelavattananon, Oxfordshire (GB)

(73) Assignee: Future Waves UK Limited, London (GB)

(*) Notice: Subject to any disclaimer, the term of this patent is extended or adjusted under 35 U.S.C. 154(b) by 276 days.

(21) Appl. No.: 12/161,790

(22) PCT Filed: Jan. 15, 2007

(86) PCT No.: PCT/GB2007/050015
§ 371 (c)(1), (2), (4) Date: Aug. 4, 2010

(87) PCT Pub. No.: WO2007/085866
PCT Pub. Date: Aug. 2, 2007

(65) Prior Publication Data
US 2010/0321113 A1 Dec. 23, 2010

Related U.S. Application Data

(60) Provisional application No. 60/761,363, filed on Jan. 24, 2006.

(30) Foreign Application Priority Data

Mar. 3, 2006 (GB) .................. 0604282.4

(51) Int. Cl.
*H03F 1/22* (2006.01)
(52) U.S. Cl. ................ 330/311; 330/283
(58) Field of Classification Search .......... 330/254, 330/283, 311
See application file for complete search history.

(56) References Cited

U.S. PATENT DOCUMENTS

| | | | |
|---|---|---|---|
| 3,641,450 A * | 2/1972 | Lunn | 330/254 |
| 3,723,895 A | 3/1973 | Peil | |
| 6,342,813 B1 | 1/2002 | Imbornone | |
| 6,784,741 B1 | 8/2004 | Redman-White | |
| 2004/0066236 A1 | 4/2004 | Fujimoto | |
| 2004/0246051 A1 | 12/2004 | Hsu | |
| 2005/0280467 A1 | 12/2005 | Shi | |
| 2006/0033575 A1 | 2/2006 | Ooya et al. | |

FOREIGN PATENT DOCUMENTS

| | | |
|---|---|---|
| EP | 1560331 | 8/2005 |
| JP | 2308606 | 12/1990 |
| JP | 2002100936 | 4/2002 |
| WO | 99/30426 | 6/1999 |
| WO | 01/41302 A1 | 6/2001 |

OTHER PUBLICATIONS

International Search Report for International Application No. PCT/GB2007/050015.
Search Report for Application No. GB 0604282.4.
International Search Report for International Application No. PCT/GB2007/050015, Apr. 23, 2007.
Search Report for Application No. GB 0604282.4, May 30, 2006.

* cited by examiner

*Primary Examiner* — Steven J Mottola
(74) *Attorney, Agent, or Firm* — Caesar, Rivise, Bernstein, Cohen & Pokotilow, Ltd.

(57) ABSTRACT

An amplifier having multiple gain modes comprises a plurality of cascoded input transistors connected to an input and arranged in parallel, a degeneration stage connected to the input transistors and having a variable impedance, and switching means for switching between different modes of the amplifier by switching off one or more of the input transistors and varying the impedance of the degeneration stage.

9 Claims, 2 Drawing Sheets

LOW NOISE AMPLIFIER

CROSS-REFERENCE TO RELATED APPLICATIONS

This national stage application claims the benefit under 35 U.S.C. §371 of International Application No. PCT/GB2007/050015 filed on Jan. 15, 2007, entitled LOW NOISE AMPLIFIER, which takes its priority from U.S. Provisional Application No. 60/761,363 filed on Jan. 24, 2006 and also takes its priority from GB Application No. 0604282.4 filed on Mar. 3, 2006, and all of whose entire disclosures are incorporated by reference herein.

FIELD OF THE INVENTION

The invention relates to Low Noise Amplifiers (LNA), in particular, to an LNA architecture suitable for large dynamic range operation.

BACKGROUND OF THE INVENTION

The input terminal(s) of an LNA often has to be matched to the resistance of the signal source driving the LNA. A commonly employed method of generating the required input resistance is inductive source degeneration. The input stage of a cascoded differential MOS LNA is depicted in FIG. 1. In the figure MOSFETs M3 and M4 act as cascodes to MOSFETs M1 and M2 respectively and have their gates connected to a constant bias voltage.

The input impedance of a pure MOSFET when driven at the gate is mainly capacitive. Therefore some form of feedback has to be employed in order to generate a real input impedance when using a MOSFET that is driven at the gate. The impedance of the RF+ input in the circuit of FIG. 1 has a real component due to the fact that the MOSFET exhibits a phase lag between its gate and source. As a result the phase contributions of the inductor at the source of M1 is reduced by 90° when viewed at its gate. Analysing the small signal model of the circuit of FIG. 1 yields the following result for the input impedance of M1[1]:

The effects of the gate-drain capacitance of M1 ($C_{gd1}$) has been ignored here for simplicity. Since the MOSFET is cascoded ignoring $C_{gd1}$ will not alter the above result much.

$$Z_{in1} = \frac{g_{m1}L_{s1}}{C_{gs1}} + j\left(\omega L_{s1} - \frac{1}{\omega C_{gs1}}\right)$$

The effect of the source degeneration inductance $L_{s1}$ (90° phase lead) has been to appear as a real input resistance of $$\frac{g_{m1}L_{s1}}{C_{gs1}}$$

(no phase lead). The input resistance of the LNA as presented in the above equation is not purely resistive and contains a reactive element. This reactive element vanishes at the resonance frequency of the LNA.

In the preceding arguments and circuit diagrams the active device used is a MOSFET. It should be pointed out that all the preceding arguments apply even when the LNA uses bipolar transistors. Even though bipolar devices already possess a real input resistance on their own (as opposed to capacitive in the case of a MOSFET), quite often it might still be required to use inductive degeneration to supplement the input resistance of the device as well as improve the linearity of the circuit. This leads to a circuit similar to that in FIG. 1, but with all the MOSFETs replaced by bipolar transistors.

Quite often LNAs have to be capable of processing a wide dynamic range of signals. When input signals are small the LNA should have a high gain and low noise figure, while linearity is not as important. When input signals are large the LNA should have a low gain and high linearity, while noise figure is not as important. This places conflicting demands on the design of the transconductance of M1 and M2 ($g_{m1}$ in the above equation).

In order to obtain a good gain and noise figure $g_{m1}$ should be maximised with a small gate-source overdrive. This limits the linearity of the circuit. It is possible to use the inductive degeneration already present in the circuit to help improve the linearity somewhat. Nonetheless, in order to obtain a very high linearity and low gain $g_{m1}$ should be minimised with a large gate-source overdrive. Thus it is important to be able to modify $g_{m1}$ in order to optimise the LNA for either noise figure or linearity for high dynamic range operation.

If $g_{m1}$ is changed by modifying the bias current of M1 the input resistance of the circuit immediately changes as well. This is predicted by the above equation for $Z_{in1}$. This destroys the input impedance match of the LNA. Input impedance matching is very important, especially if the LNA is driven by SAW filters.

SUMMARY OF THE INVENTION

It is an object of the present invention to provide a new LNA architecture preserving input impedance match across a large dynamic range. It is desirable to optimise the gain, noise figure and linearity of the LNA across a large dynamic range.

The LNA provides several course AGC settings (gain modes) in a unique manner that preserves input impedance match across the gain modes. Each gain mode can be optimised to provide a certain gain, noise figure and linearity, while all the time the input impedance match can be maintained. The new architecture enables a very high performance LNA to be realised in a single stage, which leads to power savings.

The invention provides an amplifier having multiple gain modes, comprising a plurality of cascoded input transistors connected to an input and arranged in parallel, a degeneration stage connected to the input transistors and having a variable impedance, and switching means for switching between different modes of the amplifier by switching off one or more of the input transistors and varying the impedance of the degeneration stage.

The degeneration stage may comprise a plurality of degeneration elements and the switching means is operable to vary the impedance of the degeneration stage by bypassing one or more of the degeneration elements. The plurality of degeneration elements may be arranged in series.

The switching means may be arranged so that the impedance of the degeneration stage is dependent on the number of input transistors that are switched off.

The amplifier may be arranged so that its input impedance is dependent upon the number of input transistors that are switched off and on the impedance of the degeneration stage, and preferably the switching means is arranged so that the impedance of the degeneration stage varies with the number of input transistors that are switched off such that the input impedance of the amplifier is substantially the same in each of the gain modes.

The switching means may include a transistor, which may be a MOSFET or a Bipolar transistor.

The degeneration elements may be inductance element. The inductance elements may include an inductor tapped along its length to provide two inductor portions.

The degeneration elements are resistance elements.

The input transistors may be selected from the group consisting of MOSFETS and Bipolar transistors.

In an embodiment an amplifier circuit is provided comprising a first pair of cascoded input transistors receiving respective input signals, first degeneration elements connected to a respective one of said input transistors and correspondingly connected to said first degeneration elements, a second pair of cascoded input transistors arranged in parallel with the first pair of cascoded input transistors, a second pair of respective degeneration elements arranged in series with a respective one of said first degeneration elements, and a switch for bypassing the second degeneration elements, wherein when said second input transistors are turned on the second degeneration elements are bypassed the by said switch.

The cascodes for said input transistors may be transistors. The input transistors and their cascodes may be MOSFETS, the input transistors receiving the input signal at their gates and are connected to the cascode transistors at their drains and to the degeneration elements at their sources. The cascode transistors may be connected to the adjoining cascode transistor at their drains.

The switch may be a transistor connected between respective pairs of degeneration elements by its drain and source and connected to the gates of the cascodes of the second pair of input transistors.

DETAILED DESCRIPTION

An apparatus for processing signals prior to amplification is disclosed. In the following description, a number of specific details are presented in order to provide a thorough understanding of embodiments of the present invention. It will be apparent, however, to a person skilled in the art that these specific details need not be employed to practice the present invention.

Figure 2:
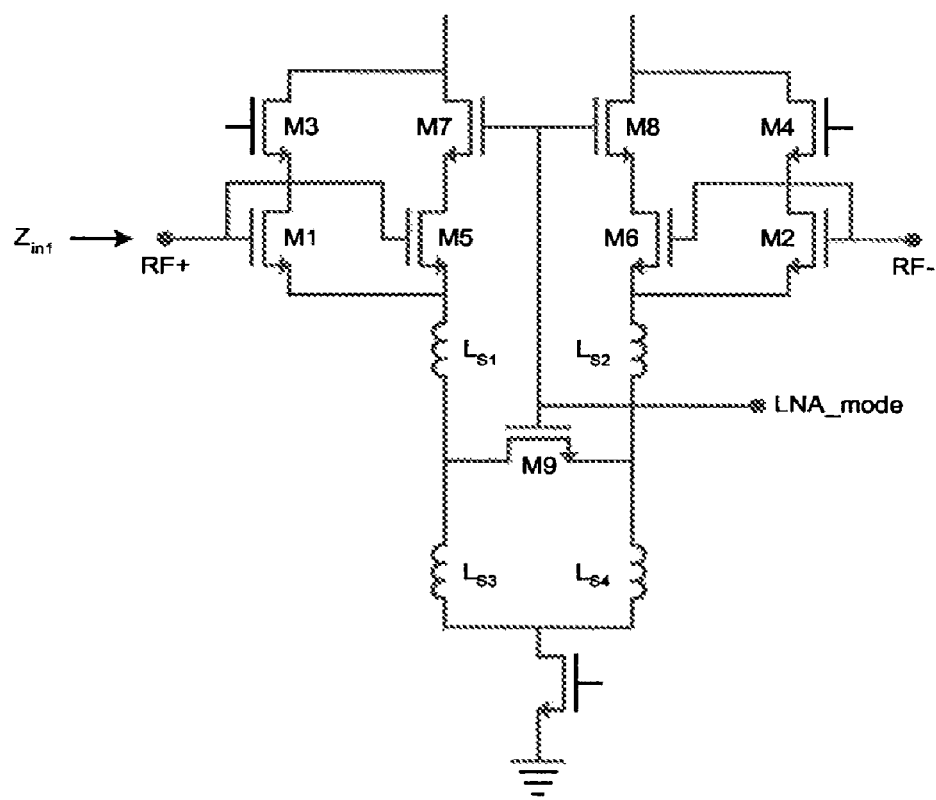
FIG. 2 shows an input stage of a cascoded differential MOS LNA according to the present invention.

The LNA illustrated in FIG. 2 has two gain modes—a high gain mode and a low gain mode. The high gain mode provides good gain and noise figure with low linearity—it is good for small input signals. The low gain mode provides good linearity with lower gain and higher noise figure—it is good for large input signals. The LNA is switched into either gain mode via the digital signal $LNA_{mode}$. In the circuit transistor M9 acts purely as a switch. Although it is depicted as a MOS transistor, any sort of switching device can be used for M9.

Figure 1:
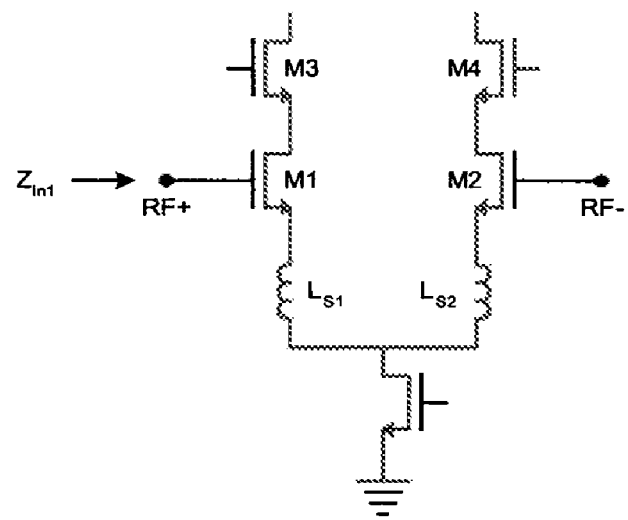
FIG. 1 shows an input stage of a cascoded differential MOS LNA of the prior art.

When $LNA_{mode}$ is at a suitably high voltage the LNA is set to high gain mode. Transistors M7 and M8 are switched on and act as cascodes for M5 and M6. Transistor M9 is also switched on and so it shorts out inductors $L_{s3}$ and $L_{s4}$. Input signals to the LNA are processed by the parallel combinations of $M_1+M_5$ and $M_2+M_6$. This arrangement gives a good combined input transconductance, which results in high gain and low noise figure. Since in the high gain mode the input devices (transistors $M_1$, $M_5$ and $M_2$, $M_6$) have a large combined width they require a lower gate-source overdrive, which results in a lower linearity compared to the low gain mode described below. The input resistance in high gain mode is given by:

$$R_{in1-high\_gain} = \frac{(g_{m1} + g_{m5})L_{s1}}{C_{gs1} + C_{gs5}}$$

Where $g_{m1}$ and $g_{m5}$ are the transconductance of $M_1$ and $M_5$, $C_{gs1}$ and $C_{gs5}$ are the gate source capacitance of $M_1$ and $M_5$, and $L_{s1}$ is the inductance of $L_{s1}$ When $LNA_{mode}$ is at 0V the LNA is set to low gain mode. Transistors M7 and M8 are switched off which prevents M5 and M6 from conducting. Furthermore M9 is also switched off and the inductors $L_{s1}$ and $L_{s3}$ appear in series while $L_{s2}$ and $L_{s4}$ appear in series. Input signals are processed by transistors $M_1$ and $M_2$, which are degenerated by the series combinations of $L_{s1}$-$L_{s3}$ and $L_{s2}$-$L_{s4}$. The LNA now appears similar to the prior art shown in FIG. 1.

Since in the low gain mode the input devices ($M_1$ and $M_2$) have a lower width (only M1 rather than M1 and M5 in parallel) the input transconductance is reduced. If the bias current of the circuit is maintained the same as in high gain mode, then the gate-source overdrive of the input devices increases as well (due to the reduced effective input device width). This results in a high linearity with the lower gain and higher noise figure as desired. The input resistance in low gain mode is given by:

$$R_{in1-low\_gain} = \frac{g_{m1}(L_{s1} + L_{s3})}{C_{gs1} + C_{gs5}}$$

Where gm1 is the transconductance of M1, $L_{s1}$ and $L_{s3}$ are the inductance values of $L_{s1}$ and $L_{s3}$, and $C_{gs1}$ and $C_{gs5}$ are the gate source capacitances of $M_1$ and $M_5$ By choosing suitable values for $g_{m1}$, $g_{m5}$, $L_{s1}$ and $L_{s3}$ the input resistance and transconductance of the LNA in low gain mode can be designed to be the same as that in high gain mode:

$$\frac{g_{m1}}{g_{m5}} = \frac{L_{s1}}{L_{s3}}$$

The mode of the LNA effectively acts as a coarse automatic gain control (AGC). Within each mode the gain of LNA can be further continuously controlled via another AGC.

Figure 3:
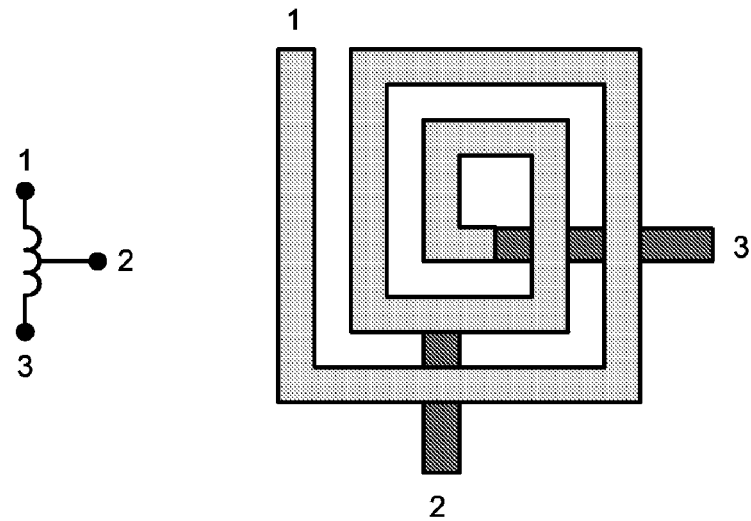
FIG. 3 shows a tapped inductor spiral.

The pairs of series inductors $L_{s1}$-$L_{s3}$ and $L_{s2}$-$L_{s4}$ do not have to be implemented as two separate inductors. In order to save area they can be implemented as a single inductor tapped midway along its spiral. This is illustrated in FIG. 3.

The inductor spiral on the right is tapped along its length at node 2. Thus the piece of the inductor between nodes 1 and 2 is equivalent to $L_{s1}$ in FIG. 2 while the piece of the inductor between nodes 2 and 3 is equivalent to $L_{s3}$ in the figure. The series combination of $L_{s1}$ and $L_{s3}$ can be obtained from the total spiral inductor from nodes 1 to 3. The equivalent circuit diagram of the inductor spiral is shown in the left of FIG. 3.

The LNA depicted in FIG. 2 uses inductive degeneration. At lower frequencies resistive degeneration is preferred over inductive degeneration. A more general case of the new LNA architecture is illustrated in FIG. 4 below.

Figure 4:
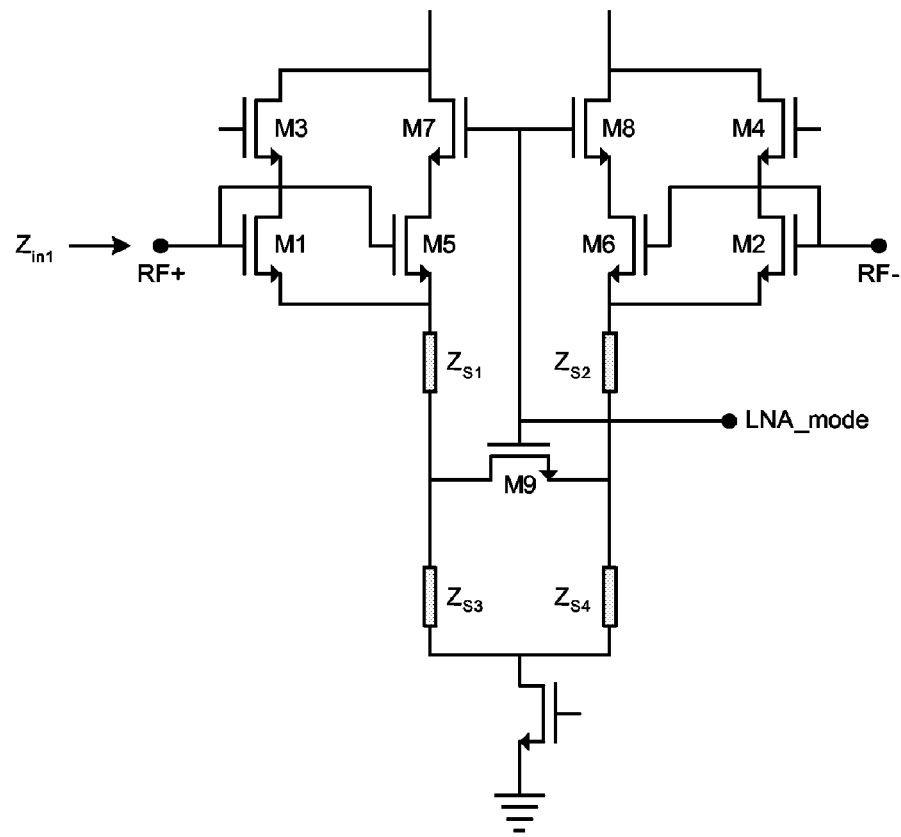
FIG. 4 is the general case of an amplifier according to the present invention.

In FIG. 4, the inductances of FIG. 2 have been replaced by resistors $Z_{s1}$ to $Z_{s4}$. In the embodiment of FIG. 4 the degeneration can be realised using either inductors or resistors. At high frequencies inductors help set the input resistance. At low frequencies resistors help set the required linearity of the circuit while switching gain modes provides a coarse control on the gain of the LNA.

The LNAs described in FIGS. 2 and 4 have two gain modes. The LNA need not be restricted to just two gain modes. If more gain modes are required for higher dynamic range operation more cascode pairs can be added in parallel. For each cascode pair that is added in parallel an extra series inductor is required in the source degeneration. A separate switching transistor and mode signal $LNA_{\_mode}$ is also required to bypass the further series inductors and to turn off the respective parallel transistors. If the source degeneration inductor is being implemented via a tapped inductor layout as depicted in FIG. 3, then an extra tap in the inductor is required for each additional gain mode.

What is claimed is:

1. An amplifier having multiple gain modes, comprising a plurality of cascoded input transistors connected to an input and arranged in parallel, a degeneration stage connected to the input transistors and having a variable impedance, and switching means for switching between different modes of the amplifier by switching off one or more of the input transistors and varying the impedance of the degeneration stage, and wherein the switching means is arranged so that the impedance of the degeneration stage is dependent on the number of input transistors that are switched off.

2. An amplifier according to claim 1, wherein the degeneration stage comprises a plurality of degeneration elements and the switching means is operable to vary the impedance of the degeneration stage by bypassing one or more of the degeneration elements.

3. An amplifier according to claim 2, wherein the plurality of degeneration elements are arranged in series.

4. An amplifier according to claim 1, wherein the amplifier is arranged so that its input impedance is dependent upon the number of input transistors that are switched off and on the impedance of the degeneration stage, and wherein the switching means is arranged so that the impedance of the degeneration stage varies with the number of input transistors that are switched off such that the input impedance of the amplifier is substantially the same in each of the gain modes.

5. An amplifier circuit as claimed in claim 1, wherein the switching means includes a transistor.

6. An amplifier circuit as claimed in claim 1, wherein said degeneration elements are inductance elements.

7. An amplifier circuit as claimed in claim 6, wherein said inductance elements include an inductor tapped along its length to provide two inductor portions.

8. An amplifier circuit as claimed in claim 1, wherein said degeneration elements are resistance elements.

9. An amplifier circuit as claimed in claim 1, wherein said input transistors are selected from the group consisting of MOSFETS and Bipolar transistors.

* * * * *